United States Patent [19]

Makita et al.

[11] Patent Number: 5,710,050

[45] Date of Patent: Jan. 20, 1998

[54] METHOD FOR FABRICATING A SEMICONDUCTOR DEVICE

[75] Inventors: Naoki Makita, Nara; Tadayoshi Miyamoto, Tenri, both of Japan

[73] Assignee: Sharp Kabushiki Kaisha, Osaka, Japan

[21] Appl. No.: 506,239

[22] Filed: Jul. 24, 1995

[30] Foreign Application Priority Data

Aug. 25, 1994 [JP] Japan ..................... 6-200603

[51] Int. Cl.⁶ ..................... H01L 21/84

[52] U.S. Cl. ..................... 437/7; 437/21; 437/99; 437/924; 437/967; 257/979

[58] Field of Search ..................... 437/7, 8, 21, 40 TFT, 437/41 TFT, 40 TFI, 99, 173, 174, 233, 924, 967; 257/51, 75, 617, 979

[56] References Cited

U.S. PATENT DOCUMENTS

| | | | |
|---|---|---|---|
| 4,450,041 | 5/1984 | Aklufi | 156/628.1 |
| 4,534,804 | 8/1985 | Cade . | |
| 4,732,867 | 3/1988 | Schnable | 437/22 |
| 4,764,432 | 8/1988 | Kalbitzer | 428/446 |
| 4,897,150 | 1/1990 | Dooley et al. | 437/233 |
| 5,260,235 | 11/1993 | Dooley et al. | 437/192 |
| 5,382,537 | 1/1995 | Noguchi | 437/41 TFT |
| 5,413,958 | 5/1995 | Imahashi et al. | 437/173 |
| 5,457,058 | 10/1995 | Yonehara | 437/173 |
| 5,529,937 | 6/1996 | Zhang et al. | 437/174 |
| 5,569,610 | 10/1996 | Zhang et al. | 437/41 TFT |
| 5,627,086 | 5/1997 | Noguchi | 117/8 |

FOREIGN PATENT DOCUMENTS

| | | |
|---|---|---|
| 389694 | 3/1990 | European Pat. Off. . |
| 59-119833 | 7/1984 | Japan . |
| 64-57615 | 3/1989 | Japan . |
| 236523 | 2/1990 | Japan . |
| 3155124 | 7/1991 | Japan . |
| 4-119633 | 4/1992 | Japan . |
| 5-136048 | 6/1993 | Japan . |
| 6-29320 | 2/1994 | Japan . |
| 6-177035 | 6/1994 | Japan . |
| 6-244103 | 9/1994 | Japan . |
| 6-244104 | 9/1994 | Japan . |
| 8-64545 | 3/1996 | Japan . |

OTHER PUBLICATIONS

D.G. Beanland et al., J. Electrochem. Soc., 125(8)(1978)1331, "Color–band generation during . . . ion implantation of Si wafers", Aug. 1978.

C.E. Hauerwas et al., IBM Tech. Discl. Bulletin, 12(10)(1970)1548, "Detection of doped regions in semiconductor devices", Mar. 1970.

*Primary Examiner*—Charles L. Bowers, Jr.
*Assistant Examiner*—Leon Radomsky
*Attorney, Agent, or Firm*—Nixon & Vanderhye P.C.

[57] ABSTRACT

The semiconductor device of the invention includes: a substrate having an insulating surface; and an active region which is formed on the insulating surface of the substrate and is constituted by a crystalline silicon film. In the semiconductor device, the active region is formed inside a crystalline silicon region formed by selective crystallization of an amorphous silicon film, and the active region is positioned by performing a mask alignment using a boundary between an amorphous silicon region of the amorphous silicon film and the crystalline silicon region.

14 Claims, 8 Drawing Sheets

METHOD FOR FABRICATING A SEMICONDUCTOR DEVICE

BACKGROUND OF THE INVENTION

1. Field of the Invention

The present invention relates to a semiconductor device and method for fabricating the same. More specifically, the present invention relates to a semiconductor device using a crystalline silicon film obtained by crystallizing an amorphous silicon film as an active region and a method for fabricating the same. The present invention is particularly effective to a semiconductor device including a thin-film transistor (TFT) provided on an insulating substrate; and as such, is applicable to an active-matrix type liquid crystal display device, a close-contact type image sensor, a three-dimensional IC, and the like.

2. Description of the Related Art

In order to realize a large-scale liquid crystal display device with a high resolution, a fast-response close-contact image sensor or a three dimensional IC with a high resolution and the like, much effort has been made for forming a high-performance semiconductor device on an insulating substrate such as a glass substrate or on an insulating film. A thin-film silicon semiconductor layer is generally used for a semiconductor device applicable to these devices.

Such a thin-film silicon semiconductor layer is roughly classified into two categories; namely, that made of an amorphous silicon (a-Si) semiconductor and that made of a crystalline silicon semiconductor. Of the above-mentioned two types of thin-film silicon semiconductors, an amorphous silicon semiconductor is currently used most frequently for general applications. This is because an amorphous silicon semiconductor can be mass-produced using a vapor-phase growing method more easily and at a relatively low temperature as compared with a crystalline silicon semiconductor. Despite these advantages, the physical properties, e.g., conductivity, of the amorphous silicon semiconductor are inferior to those of the crystalline silicon semiconductor. In order to realize higher performance characteristics, there has been a great demand for the establishment of a method for fabricating a semiconductor device made of a crystalline silicon semiconductor. Examples of crystalline silicon semiconductors include polycrystalline silicon, microcrystalline silicon, amorphous silicon containing a crystalline component, and semi-amorphous silicon exhibiting an intermediate state between crystallinity and non-crystallinity.

The following three methods are currently employed for obtaining the above-mentioned thin-film silicon semiconductor layer exhibiting some crystallinity:

(1) A crystalline silicon semiconductor film is grown directly on a substrate during the deposition of the film.

(2) An amorphous silicon semiconductor film is initially deposited, and subsequently crystallized using laser beam energy or the like.

(3) An amorphous silicon semiconductor film is initially deposited, and subsequently crystallized by the application of thermal energy thereto.

These conventional methods, however, have the following problems.

In employing method (1), the deposition and the crystallization of the film proceed simultaneously. Therefore, it is indispensable to deposit a thick silicon film in order to obtain a crystalline silicon film composed of grains having a large size. However, it is technologically difficult to uniformly deposit a film having satisfactory semiconductor physical properties over the entire surface of a substrate. Furthermore, since such a film is deposited at a relatively high temperature of 600° C. or higher, an inexpensive glass plate is unsuitable as a substrate which can be used in this method, so that the necessary cost becomes disadvantageously high.

In employing method (2), a crystallization phenomenon is utilized during a process for melting and solidifying a film. As a result, the grain boundaries are satisfactorily treated even though the grain size of the resulting crystal is small. Thus, a crystalline silicon film of high quality can be obtained. Though this method (2) has such an advantages, when an excimer laser beam which is currently used most frequently is irradiated, for example, the area to be irradiated with the laser beam is small, so that throughput becomes disadvantageously low. In addition, the stability of the excimer laser is not sufficient in order to uniformly treat the entire surface of a large-scale substrate. In light of these problems, method (2) should be regarded as a next-generation technology.

Method (3) has an advantage of being applicable to the treatment of a larger-scale substrate as compared with methods (1) and (2); however, a heat treatment at a high temperature of 600° C. or higher over several tens of hours is needed to realize the crystallization. Thus, in order to reduce costs by using an inexpensive glass substrate and improve the resulting throughput, two incompatible purposes must be fulfilled at the same time: the heating temperature should be lowered for the purpose of reducing the cost, and the crystallization should be realized in a shorter period of time in order to improve the throughput.

In addition, since method (3) utilizes a solid phase crystallization (epitaxy) phenomenon, crystal grains are laterally grown in parallel with respect to the substrate surface, so that grains having a size of several μm are obtained. As a result, the crystal grains thus grown come into contact with each other so as to form grain boundaries. Since these grain boundaries function as a trap level for carriers, the presence of the grain boundaries is likely to cause the decrease in field-effect mobility of TFTs.

Japanese Laid-Open Patent Publications Nos. 64-57615, 4-119633, 6-29320, 3-155124, and 5-136048 disclose methods for solving the above-described problems of the grain boundaries by employing method (3). According to these disclosed methods, a part of an amorphous silicon film is selectively crystallized by the use of some means, and then the crystals are grown around the crystallized amorphous silicon film by using the resulting crystallized region as a seed, thereby controlling the grain boundaries.

More specifically, Japanese Laid-Open Patent Publications Nos. 64-57615, 4-119633, and 6-29320 employ an energy beam irradiation method in which a laser beam, an electron beam or an infrared ray is used for selectively crystallizing the seed region. Japanese Laid-Open Patent Publication No. 64-57615 does not disclose the detailed process steps for specifying the seed region. According to Japanese Laid-Open Patent Publication No. 4-119633; a silicon oxide film is formed on an amorphous silicon film, and a metallic film functioning as a reflection film for reflecting an energy beam is further formed on the silicon oxide film. An opening for irradiating the energy beam is provided in a part of the metallic film, thereby selectively crystallizing a limited region of the amorphous silicon film under the opening of the metallic film.

On the other hand, according to Japanese Laid-Open Patent Publication No. 6-29320, a silicon oxide film and a silicon film are formed on an amorphous silicon film and an opening is provided in the two upper silicon films so as to irradiate an energy beam onto the lower amorphous silicon film. Since the upper silicon films absorb the energy beam, the remaining part of the amorphous silicon film under the region covered with the upper silicon films does not receive the energy beam, and therefore the limited region of the amorphous silicon film under the opening is selectively crystallized. In both patent publications, a heat treatment is performed after the irradiation process step, thereby growing a crystalline silicon film from the selectively crystallized seed region so as to reflect the crystallinity.

According to the methods disclosed in Japanese Laid-Open Patent Publications Nos. 3-155124 and 5-136048, by initially introducing some foreign material into an amorphous silicon film as a nucleus for crystal growth and then by heat-treating the film, a crystalline silicon film composed of grains having a large size can be grown by using the foreign material as a nucleus.

According to a method disclosed in Japanese Laid-Open Patent Publication No. 3-155124, by implanting silicon ($Si^+$) ions into an amorphous silicon film by an ion implantation method and then by heat-treating the film, a polycrystalline silicon film composed of grains having a size of several μm can be grown. According to a method disclosed in Japanese Laid-Open-Patent Publication No. 5-136048, by spraying Si particles having a size of 10 to 100 nm along with a high-pressure nitrogen gas to an amorphous silicon film, a growth nucleus is formed. In both of these methods, an implantation mask made of a photoresist is formed on the amorphous silicon film, a foreign material is selectively introduced into the amorphous silicon film through the implantation mask, and a heat treatment is performed so as to form a seed region. Thereafter, by crystallizing the amorphous silicon film around the seed region, a crystalline silicon film of high quality is formed and a semiconductor device is formed by using the crystalline silicon film thus obtained.

The present inventors have found that an amorphous silicon film can be crystallized by introducing a very small amount of metal elements such as nickel, palladium or lead into the surface of the amorphous silicon film and then heat-treating the film at 550° C. for about four hours.

This mechanism can be understood as follows: First, crystal nuclei are generated from the metal elements as the nuclei for crystal growth at an earlier stage of the heat treatment. Then the metal elements function as catalysts for promoting the crystal growth, thereby rapidly advancing the crystallization. Hereinafter, these metal elements will be called "catalyst elements". The crystalline silicon film crystallized by the use of these catalyst elements as promoters has a plurality of needle-like crystals and column-like crystals, unlike the twin crystal structure of the crystal grains grown from a nucleus by a generally used solid-phase growth method. The respective needle-like crystals and the column-like crystals are in an ideal single crystalline state.

By selectively introducing the catalyst elements into a part of the amorphous silicon film, the crystallization is generated only in the introduction regions at a low temperature and the other regions remain amorphous. If the heat treatment is further continued after the initial crystallization, the crystal growth portion extends from the crystallized portion by the selective introduction of the catalyst elements towards the surrounding amorphous portion in a lateral direction (or the direction parallel to the surface of the substrate). In this laterally crystallized region, the needle-like crystals or the column-like crystals extend one-dimensionally along the growth direction parallel to the surface of the substrate, and no grain boundaries exist along the growth direction. Therefore, by forming an active region for a semiconductor device by using this laterally crystallized region, it is possible to realize a high-performance semiconductor device.

With respect to a method for fabricating a crystalline silicon film to be used as an active region; the solid-phase crystallization method allowing for a crystallinity with a certain stability inside a substrate as described above as method (3), is currently most preferable in view of processing a large-scale substrate. However, as described above, a crystalline silicon film fabricated by a conventional solid-phase crystallization method is likely to be largely affected by the grain boundaries and exhibits a twin crystal structure having much defect within a single crystal grain.

Therefore, in order to suppress the problem of the grain boundaries to a minimal level; the above-mentioned methods for artificially controlling the grain boundaries such as the techniques disclosed in Japanese Laid-Open Patent Publications Nos. 64-57615, 4-119633, 6-29320, 3-155124, and 5-136048, and the technology found by the present inventors for laterally crystallizing by selectively introducing a very small amount of catalyst elements, can be regarded as very effective methods.

By using these methods, a high-performance semiconductor device can be obtained. However, some serious problems occur intermittently during the fabrication process thereof.

According to the above-described techniques for artificially controlling the grain boundaries, a part of the amorphous silicon film is selectively crystallized by some method, and by subsequently using the crystallized region as a large seed, the crystallization is generated around the region in a lateral direction. In the region which has been crystallized during the previous process step and will be used as a seed, the crystal nuclei are generated at random, and the region is further crystallized. However, in the crystalline silicon region to be grown around the crystallized region functioning as a seed, the crystals are grown so as to reflect the crystallinity around the seed region, so that the resulting crystallinity becomes very satisfactory with the growth direction controlled. Consequently, the crystallinity of the crystalline silicon film in the region being used as a seed (or the region where the nuclei are generated artificially) becomes totally different from the crystallinity in the region grown in a lateral direction around the seed. If a plurality of semiconductor devices are formed at random on such a crystalline silicon film, then it is impossible to obtain satisfactory semiconductor devices having uniform characteristics because of the difference in the crystallinity of the crystalline silicon film to be used as an active region.

Therefore, in the case of using the above-described techniques for artificially controlling the grain boundaries, it is necessary to form desired semiconductor devices at precise positions within a crystalline silicon region to be used. Accordingly, it is indispensable to perform a mask alignment process during the patterning of the silicon film to be used as an active region. While this mask alignment is performed at several process steps, a mask alignment mark formed by a first mask is generally used for the subsequent mask alignment processes. However, in the case of using the above-described technology, the first mask becomes a mask for selectively growing the crystals from the crystallized region to be used as a seed.

Figure 8A:
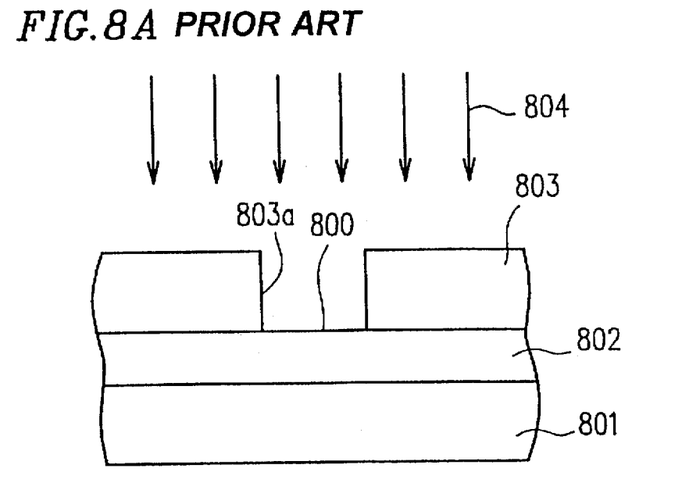
FIGS. 8A and 8B are cross-sectional views sequentially showing the process steps of the crystal growth method disclosed in Japanese Laid-Open Patent Publication No. 5-136048.

The technique disclosed in Japanese Laid-Open Patent Publication No. 5-136048 will be described as an example. First, as shown in FIG. 8A, a photoresist 803 functioning as a first mask is applied onto an amorphous silicon film 802 formed on the insulating substrate 801. By exposing a predetermined portion of the amorphous silicon film 802 to light through the first mask, a photoresist opening 803a is provided over a region 800 to be selectively crystallized. In this patent publication, Si particles 804 are sprayed onto the photoresist 803 in order to artificially generate the crystal nuclei. However, any method can be used so long as the crystallization can be performed selectively.

Figure 8B:
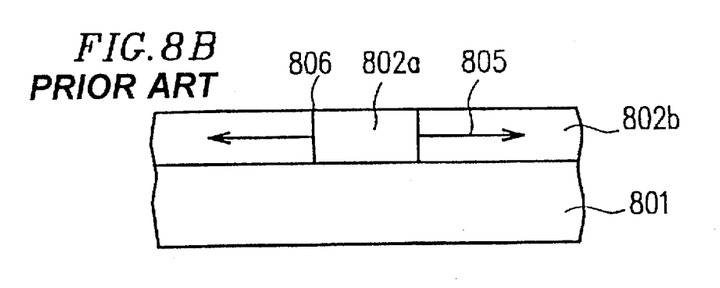

Then, as shown in FIG. 8B, the photoresist 803 is removed and the heat treatment is performed so as to first crystallize the amorphous silicon film in the region 800. As a result, a crystalline silicon region 802a to be used as a seed is formed. If the heat treatment is continuously performed, the crystals grow from the seed region 802a in a lateral direction as indicated by the arrow 805, so that a laterally crystallized crystalline silicon region 802b is formed. Thereafter, an active region to be a device is formed by using this crystalline silicon film. In this stage, an alignment mark patterned by using the first mask can be recognized easily in a boundary 806 between the seed region 802a and the laterally crystallized region 802b. The alignment is performed during the next process step depending upon the subtle gradation of the colors caused by the difference in the crystallinity between the regions 802a and 802b. However, it is very difficult to perform the alignment precisely, and an auto-alignment indispensable to the mass-production can not be performed.

This problem also exists in the other methods for controlling the grain boundaries mentioned above. Japanese Laid-Open Patent Publications Nos. 64-57615, 4-119633, 6-29320, and 5-155124, and the technology found by the present inventors for selectively introducing catalyst elements can not solve this serious problem.

Figure 7A:
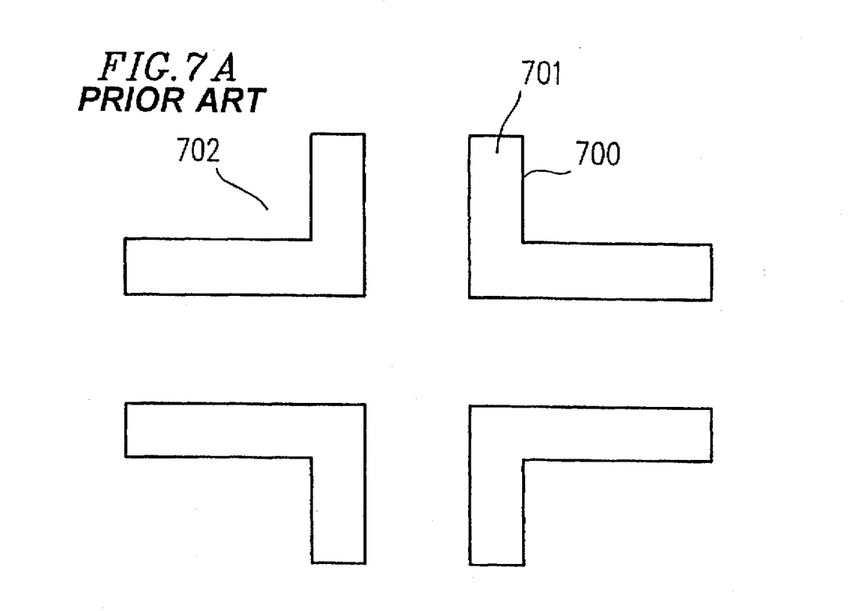
FIGS. 7A and 7B are plan views illustrating a conventional mask alignment method.
Figure 7B:
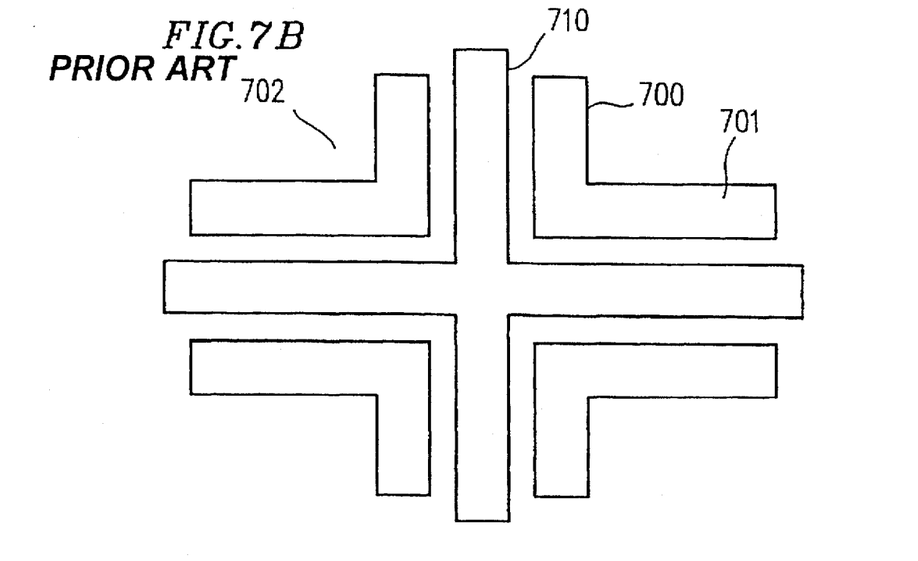

According to a conventional method, the mask alignment is generally performed depending upon the alignment mark, for example, as shown in FIG. 7A. In the case where the first mask is used for the selective crystallization, it is assumed that an opening is provided along an alignment mark 700 of the first mask. Then, a selectively crystallized seed region 701 is formed inside the mark 700, and a laterally crystallized crystalline silicon region 702 in which the crystals are grown in a lateral direction so as to reflect the crystallinity of the region around the seed region 701 is formed outside the alignment mark 700. FIG. 7A shows this state. Next, an alignment mark 710 of a second mask is disposed as shown in FIG. 7B so that the mark 710 is aligned with the alignment mark 700 of the first mask. Since the alignment mark 700 of the first mask can not but be recognized depending upon the subtle difference between the crystallinity of the crystalline silicon region 701 inside the mark 700 and that of the crystalline silicon region 702 outside the mark 700. Since almost no gradation exists between these two regions 701 and 702, it is very difficult to align the alignment mark 710 with the alignment mark 700.

SUMMARY OF THE INVENTION

The semiconductor device of the invention includes: a substrate having an insulating surface; and an active region which is formed on the insulating surface of the substrate and is constituted by a crystalline silicon film. In the semiconductor device, the active region is formed inside a crystalline silicon region formed by selective crystallization of an amorphous silicon film, and the active region is positioned by performing a mask alignment using a boundary between an amorphous silicon region of the amorphous silicon film and the crystalline silicon region.

In one embodiment, a catalyst element for promoting a crystallization of the amorphous silicon film by a heat treatment is introduced into the crystalline silicon region.

According to another aspect of the present invention, a method for fabricating a semiconductor device is provided. The method includes the steps of: forming an amorphous silicon film on a substrate; selectively crystallizing a part of the amorphous silicon film; performing a mask alignment by using a boundary between a crystalline silicon region formed by selectively crystallization of the amorphous silicon film and an amorphous silicon region of the amorphous silicon film which has not been crystallized yet; and patterning the amorphous silicon film depending upon the mask alignment.

According to still another aspect of the present invention, a method for fabricating a semiconductor device is provided. The method includes the steps of: forming an amorphous silicon film on a substrate; selectively introducing into the amorphous silicon film a catalyst element for promoting a crystallization of the amorphous silicon film before or after the step of forming the amorphous silicon film on the substrate; selectively crystallizing the amorphous silicon film by a heat treatment so that crystals are grown in a region around a region to which the catalyst element is selectively introduced, in a direction substantially parallel to a surface of the substrate; performing a mask alignment by using a boundary between a crystalline silicon region formed by selective crystallization of the amorphous silicon film in the direction substantially parallel to the surface of the substrate and an amorphous silicon region which has not been crystallized yet, the boundary being located in an outer periphery of the crystalline silicon region; and patterning the amorphous silicon film depending upon the mask alignment so as to form an active region.

According to still another aspect of the present invention, a method for fabricating a semiconductor device is provided. The method includes the steps of: forming an amorphous silicon film on a substrate; selectively crystallizing a region of the amorphous silicon film, thereby forming a mask alignment mark defined by a boundary between the selectively crystallized region and an amorphous silicon region; and performing a mask alignment by using the mask alignment mark.

In one embodiment, the step of forming the mask alignment mark includes the steps of: initially crystallizing a seed region included in the selectively crystallized region of the amorphous silicon film; crystallizing the amorphous silicon film from the seed region in a lateral direction; and enlarging a size of the mask alignment mark in accordance with the crystallization of the amorphous silicon film.

In another embodiment, the step of performing the mask alignment includes aligning a position of a second mask alignment mark with a position of the mask alignment mark, the second mask alignment mark consisting of a plurality of curves and/or lines arranged in a uniform manner.

In still another embodiment, the second mask alignment mark consists of three or more closed curves arranged concentrically.

In still another embodiment, the step of forming the mask alignment mark includes selectively introducing into the seed region of the amorphous silicon film a catalyst element for promoting the crystallization of the amorphous silicon film.

In still another embodiment, at least one element selected from a group consisting of Ni, Co, Pd, Pt, Cu, Ag, Au, In, Sn, Al, P, As and Sb is used as the catalyst element.

After earnestly making every effort to study the crystallization of an amorphous silicon film in order to accomplish the above-mentioned objectives, the present inventors have obtained the following results.

In the case of controlling the grain boundaries by using the methods described above, it is necessary to perform a photolithography process for selectively crystallizing an amorphous silicon film. However, needless to say, a photoresist or a metallic film which has been used as a mask layer is required to be removed before performing a heat treatment for further advancing the crystallization. Therefore, if the entire surface of a substrate has been crystallized, only the boundary between the seed region of the crystalline silicon film and the laterally crystallized region can be used for performing the mask alignment during the patterning of the element region. In such a case, the mask alignment can not but be performed based on the gradation caused by the difference in the crystallinity, and therefore it is difficult to perform the alignment precisely. Thus, in order to accomplish the objectives of the invention, the crystallization of the amorphous silicon film is required to be finished at the point where some amorphous silicon region remains but a crystalline silicon region large enough to form an element has been formed. Then, the alignment is required to be performed by using the boundary between the amorphous silicon film and the crystalline silicon film. The boundary can be recognized easily depending upon the apparent difference in the surface conditions and the optical characteristics between the amorphous silicon film and the crystalline silicon film.

The optical characteristics of an amorphous silicon film are greatly different from those of a crystalline silicon film. For example, the refractive index of an amorphous silicon film is approximately 4.0, while that of a crystalline silicon film is in an approximate range of 3.6 to 3.8. In addition, a difference also exists in a surface morphology between the two films. For example, the surface of an amorphous silicon film is less rugged, flatter and smoother as compared with that of a crystalline silicon film formed by recrystallization. Therefore, a boundary between the amorphous silicon film and the crystalline silicon film can be recognized very easily based on such differences. Thus, by using the mask alignment mark defined by this boundary for the mask alignment, it is possible to align the positions of the marks precisely and perform an auto-alignment during the photolithography process in order to mass-produce the devices.

In the semiconductor device of the invention, an active region is formed within a crystalline silicon region formed by selective crystallization of an amorphous silicon film, and the mask alignment is performed by using the boundary between the amorphous silicon film and the crystalline silicon film. Therefore, the active region can be positioned based on the boundary between the amorphous silicon film and the crystalline silicon film where the gradations are obviously different from each other. As a result, it is possible to position the active region easily and precisely.

Consequently, various factors causing degradations or variations in the characteristics of a semiconductor device can be eliminated, and the production yield, particularly important for a large scale semiconductor device, can be remarkably improved.

Moreover, in the semiconductor device of the invention, a catalyst element for promoting the crystallization of the amorphous silicon film by heat treatment is introduced into the amorphous silicon film so as to form a crystalline silicon film. Accordingly, the crystalline silicon film including an active region, resulting from the crystallization of the amorphous silicon film, can exhibit an even higher crystallinity than a crystallinity resulting from a generally used solid-phase growth method. In such a case, it is possible to perform an auto-alignment of an element region with respect to the crystalline silicon region of high quality, thereby allowing for a mass-production of semiconductor devices using a semiconductor film in which the grain boundaries are controlled.

According to a method for fabricating a semiconductor device of the invention, since the mask alignment is performed by using a boundary between a crystalline silicon region formed by selective crystallization of an amorphous silicon film and an amorphous silicon region which has not been crystallized yet, the selectively crystallized amorphous silicon film can be patterned precisely and easily based on the boundary portion between the amorphous silicon region and the crystalline silicon region having apparently different gradations.

Furthermore, according to a method for fabricating a semiconductor device of the invention, the amorphous silicon film to which a catalyst element is introduced, is selectively crystallized by a heat treatment. The amorphous silicon film is further crystallized around the region to which the catalyst element has been selectively introduced in a direction substantially parallel to the surface of the substrate; thereby performing the mask alignment by using a boundary between the crystalline silicon region and the amorphous silicon region which has not been crystallized yet, the boundary being located in the outer periphery of the resulting crystalline silicon region. As a result, a crystalline silicon film With a crystallinity of higher quality as compared with the crystallinity obtained by a generally used solid-phase growth method can be formed by performing a heat treatment at 600° C. or lower, and the mask alignment can be performed easily during each process step.

Thus, the invention described herein makes possible the advantage of providing a highly reproducible semiconductor device allowing for formation of a crystalline silicon film with a crystallinity of higher quality than the crystallinity resulting from a generally used solid-phase growth method by performing a heat treatment at 600° C. or lower, and easily performing a mask alignment during each process step; and a method for fabricating the same.

This and other advantages of the present invention will become apparent to those skilled in the art upon reading and understanding the following detailed description with reference to the accompanying figures.

DESCRIPTION OF THE PREFERRED EMBODIMENTS

First, the fundamental principle of the invention will be described.

The present invention has the following two points. One point lies in that the selective crystallization is finished while leaving some amorphous silicon regions. The other point lies in that the mask alignment during the next process step is performed by using the boundary between the amorphous silicon region and selectively crystallized crystalline silicon region.

Figure 3A:
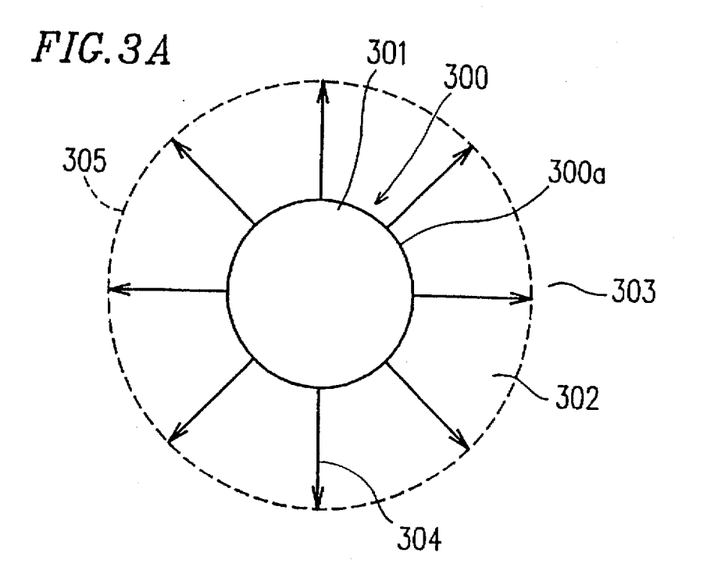
FIGS. 3A and 3B are plan views illustrating a fundamental principle of the invention, showing an alignment mark of the first mask having a circular pattern and an alignment mark of the second mask having a circular pattern, respectively.

According to the present invention, an alignment mark 300 of a first mask is assumed to have a circular pattern 300a as shown in FIG. 3A. An opening is provided inside the alignment mark 300 and a selectively crystallized seed region 301 is disposed, for example, inside the opening. In this case, a laterally crystallized region 302 reflecting the crystallinity of the seed region 301 is located in the region surrounding the alignment mark 300.

If the heat treatment for the crystallization is interrupted before completing the crystallization, then the region which has not been laterally crystallized will remain an amorphous silicon region 303. As shown in FIG. 3A, since a lateral crystallization 304 is performed so as to reflect the shape of the seed region 301, i.e., the shape of the alignment mark 300, the resulting laterally crystallized region 302 becomes donut-shaped and is concentric with the alignment mark 300. Thus, at this point, the alignment mark 300 of the first mask can be identified only by the difference between the crystallinity of the region 301 and that of the region 302, and therefore the mark 300 can hardly be recognized. On the other hand, a boundary 305 is concentrically formed with the alignment mark 300 between the laterally crystallized region 302 and the amorphous silicon region 303 and can be recognized very easily.

Figure 3B:
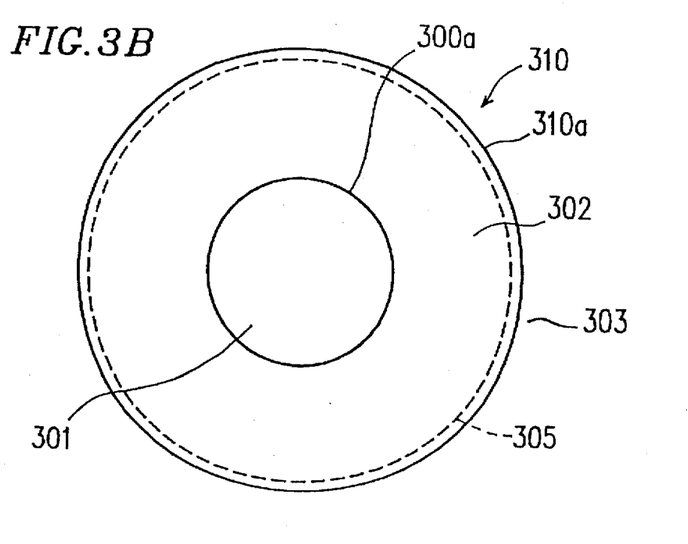
Figure 4:
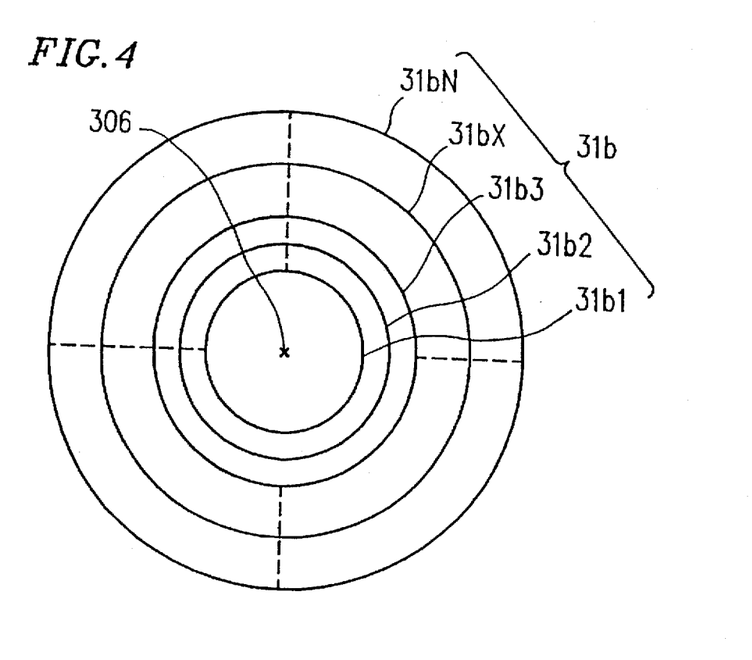
FIG. 4 is a plan view illustrating a fundamental principle of the invention, showing an alignment mark of the second mask having a pattern consisting of multiple concentric circles.

Therefore, as shown in FIG. 3B, by using an alignment mark 310 of the second mask having a circular pattern 310a which can be aligned with the boundary 305 between the laterally crystallized region 302 and the amorphous silicon region 303, the positioning can be performed precisely. In such a case, it is necessary to set the diameter of the alignment mark 310a of the second mask by anticipating the growth distance of the laterally crystallized region 302. In the case where the expected growth distance of the laterally crystallized region 302 is unclear, the alignment mark 310 of the second mask is required to have a multiple concentric pattern 31b consisting of several concentric circles $31b_1$ to $31b_N$ resembling to the growth rings of a tree, as shown in FIG. 4. That is to say, the positioning can be performed by using a concentric pattern $31b_x$ corresponding to the growth distance, or the length of the laterally crystallized region 302. In this case, the center 306 of the concentric circles is the same as the center of the circular alignment pattern of the first mask.

In this example, the principle of the invention has been described by using a circular alignment mark. However, any pattern of other shapes can also be used so long as the pattern can realize the same concept.

Figure 5A:
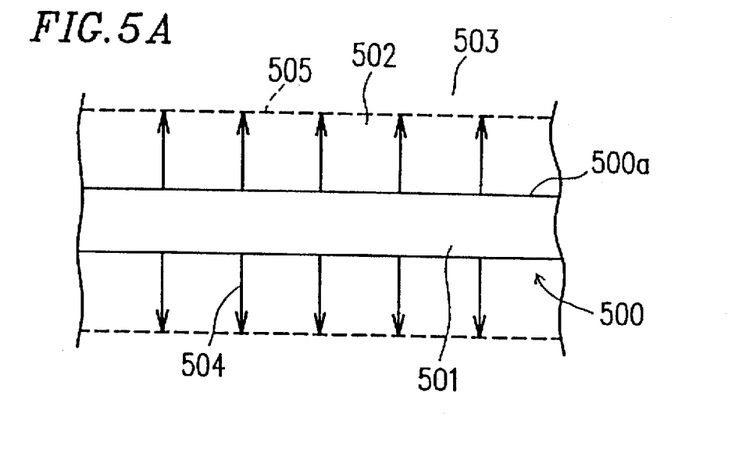
FIGS. 5A and 5B are plan views illustrating a fundamental principle of the invention, showing an alignment mark of the first mask having a linear pattern and an alignment mark of the second mask having a linear pattern, respectively.

For example, the case of using an alignment mark 500 having a linear pattern 500a as shown in FIG. 5 will be described. In this case, a seed region 501 is assumed to be inside the mark 500. Then, the crystallization is generated in a direction vertical to the linear alignment marks as indicated by arrows 504, so that a laterally crystallized region 502 is formed. A region which has not been crystallized yet remains an amorphous silicon film 503. In such a case, as shown in FIG. 5A, a linear boundary 505 is formed between the two regions 502 and 503 so as to reflect the shape of the alignment mark 500.

Figure 5B:
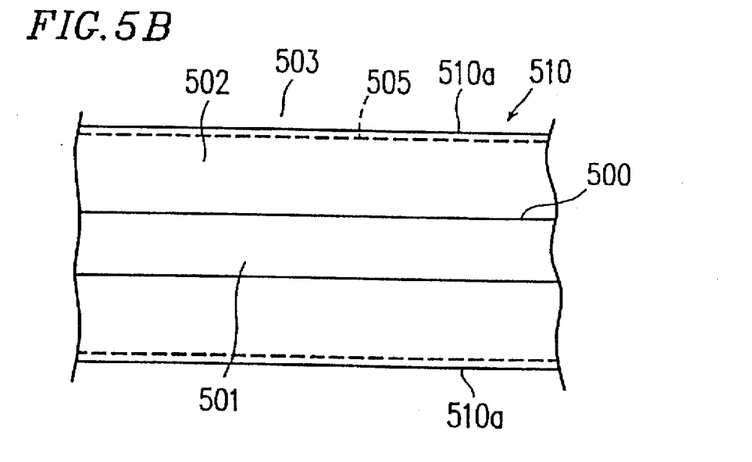

Therefore, as shown in FIG. 5B, by using an alignment mark 510 of the second mask having a linear pattern 510a consisting of two parallel lines and by positioning the mark 510 so as to substantially align the mark 510 with the boundary 505, the alignment can be performed precisely.

Figure 6:
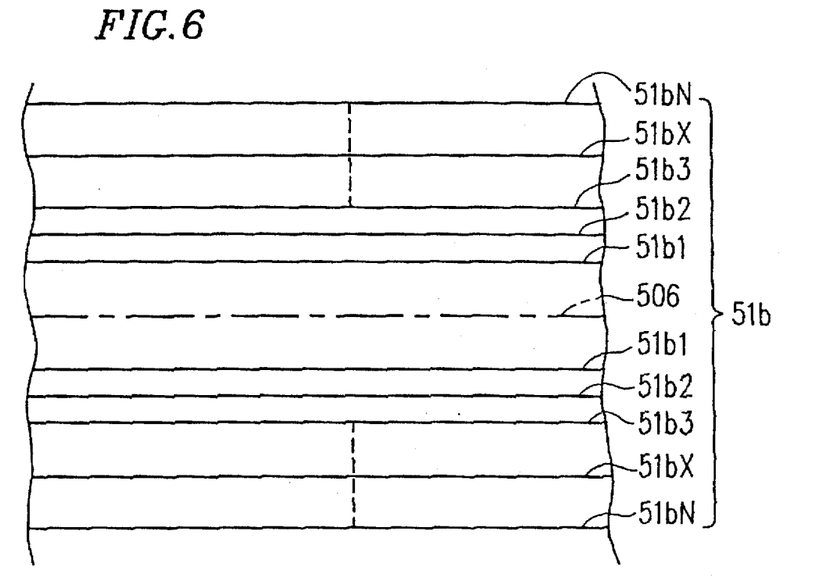
FIG. 6 is a plan view illustrating a fundamental principle of the invention, showing an alignment mark of the second mask having a stripe-shaped pattern.

In the case where the expected growth distance of the laterally crystallized region 502 is unclear, the second alignment mark 510 is required to have a stripe-shaped pattern 51b consisting of a plurality of parallel lines $51b_1$ to $51b_N$, as shown in FIG. 6. That is to say, the positioning can be performed by using a line $51b_N$ corresponding to the boundary 505. In this case, the lines $51b_1$ to $51b_N$ constituting the alignment mark of the second mask are disposed so as to be linearly symmetric with respect to a center line 506 of the linear alignment mark of the first mask.

The method found by the present inventors for lateral crystallization by selectively introducing a very small amount of metal element such as nickel, palladium and lead into the amorphous silicon film and then by performing a heat treatment has the advantage of realizing the crystallization at a lower temperature, e.g., 580° C. or lower as compared with other methods. In addition, according to the method of the invention, the necessary crystallization can be advantageously finished by performing a heat treatment of a shorter duration.

That is to say, in the case of using an inexpensive glass substrate, the shrinkage or the deflection of the substrate is adversely generated during the heat treatment for the crystallization. For example, a Corning 7059 glass (product name; manufactured by Corning) generally used for an active-matrix type liquid crystal display device has a glass distortion point of 593° C. Thus, in view of the processing a large-scale substrate, the heat treatment should not be performed at a temperature higher than the glass distortion point. On the other hand, in the case of employing a conventional solid-phase growth method, the heat treatment is required to be performed at least at 600° C. for 20 hours or more, though depending upon the method and the conditions for growing a starting a-Si film. For example, according to a technique disclosed in Japanese Laid-Open Patent Publication No. 5-136048, the heat treatment is performed at 650° C. or higher.

However, according the crystallization method using a catalyst element found by the present inventors, the concentration of the catalyst element greatly differs between the region of a semiconductor film to which the catalyst element is introduced (the seed region) and the laterally crystallized region of the film. Thus, in the case of forming a TFT or the like so that the region to which the catalyst element is introduced is included in the region where an element is to be formed; if the region to which the catalyst element is introduced is included in a region where a channel is to be formed, the variation of the characteristics of the TFT is caused by the difference in the crystallinity. In addition, a high concentration of catalyst elements increases a leak current, which adversely degrades the TFT characteristics. Therefore, in the case of employing the technology for selective crystallization by using a catalyst element, it is necessary to align the selectively crystallized silicon region with an element region more precisely as compared with the other grain boundary controlling methods. Consequently, the present invention is applicable to the technology very effectively.

Hereinafter, an example of the present invention will be described with reference to accompanying drawings.

EXAMPLE 1

Figure 1A:
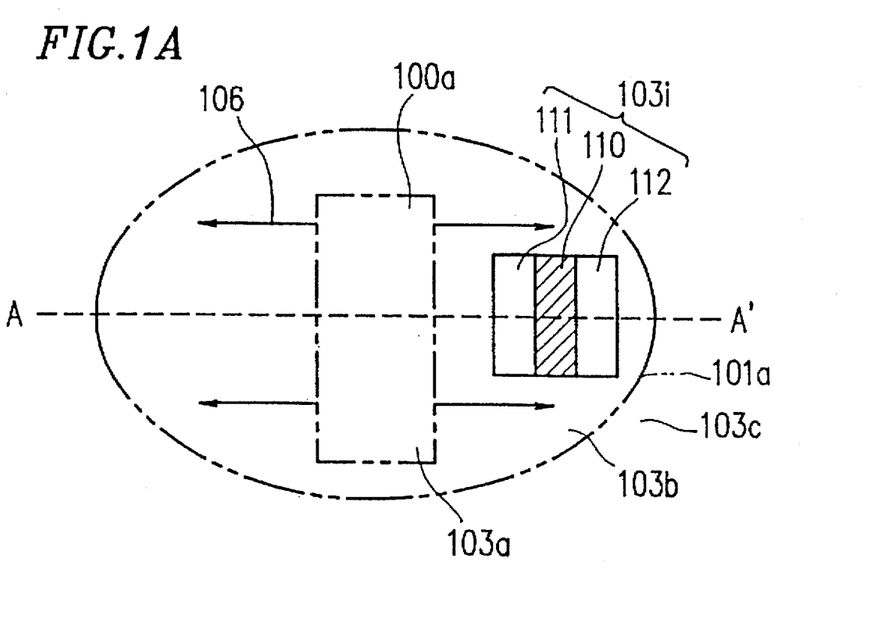
FIGS. 1A and 1B are plan views illustrating a semiconductor device and a method for fabricating the same according to a first example of the invention.
Figure 1B:
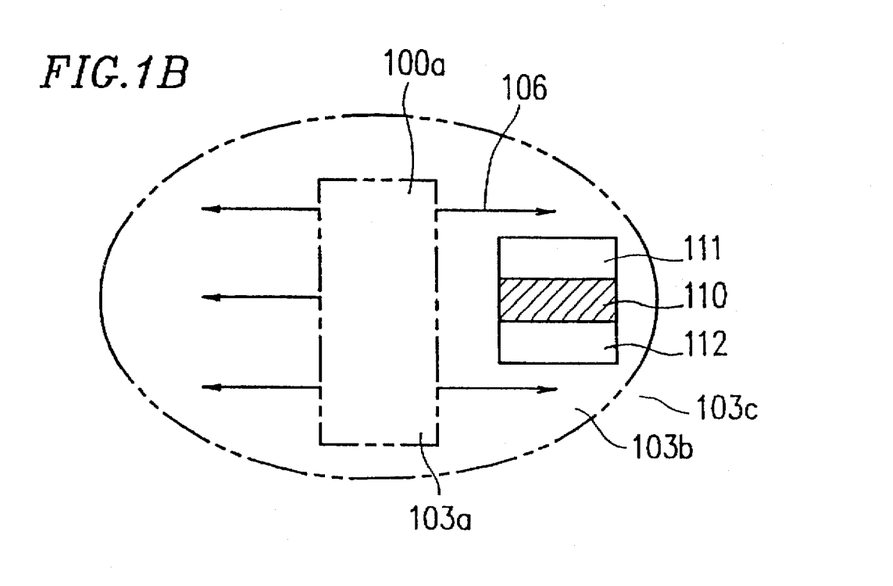

FIGS. 1A and 1B are plan views illustrating a thin-film transistor (TFT) and a method for fabricating the same according to an example of the invention. FIGS. 2A to 2F are cross-sectional views, taken along the line A-A' in FIG. 1A, sequentially showing the process steps for fabricating the TFT according to this example of the invention.

Figure 2A:
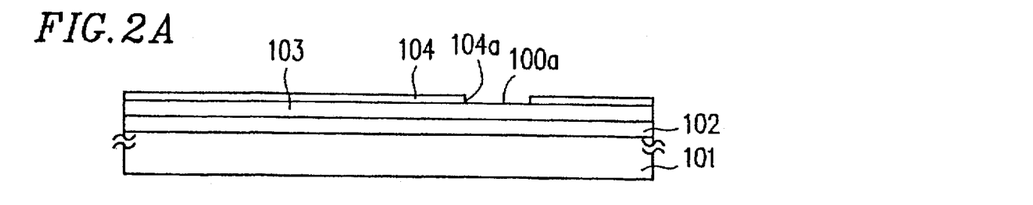
FIGS. 2A to 2F are cross-sectional views sequentially showing the process steps for fabricating the semiconductor device according to the first example of the invention.
Figure 2B:
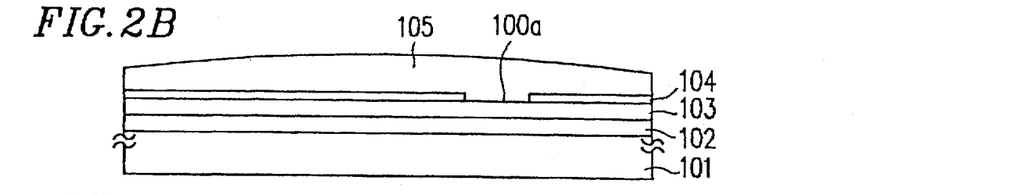
Figure 2C:
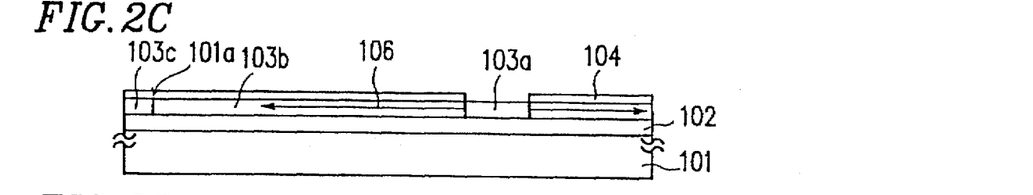
Figure 2D:
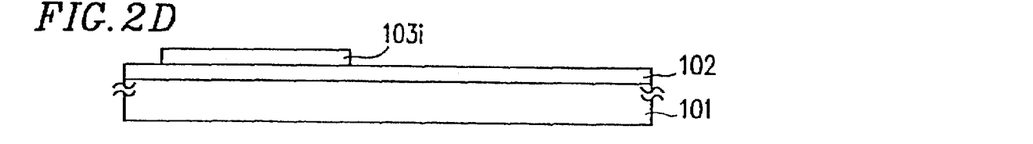
Figure 2E:
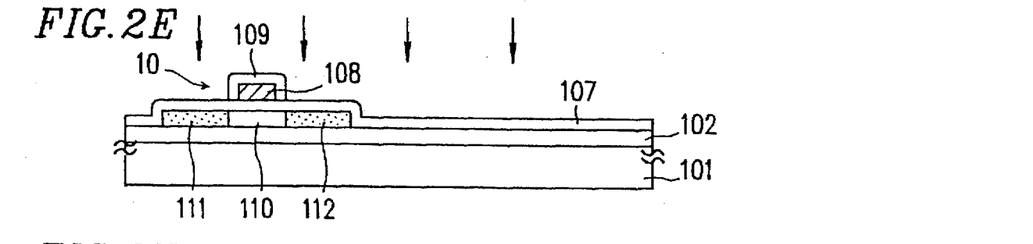
Figure 2F:
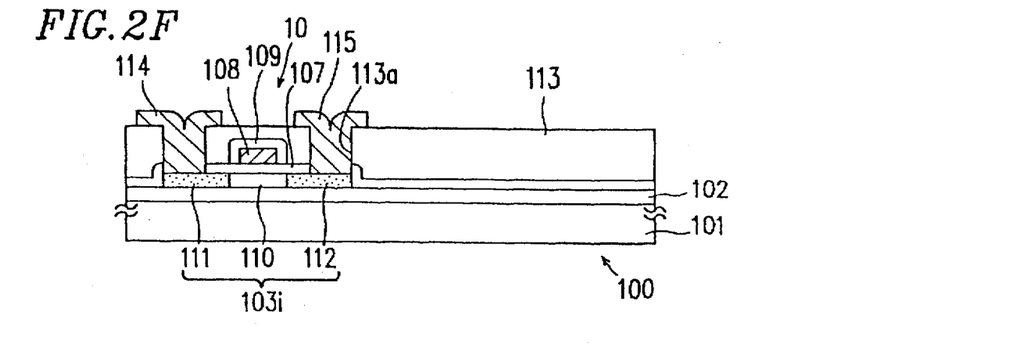

As shown in FIG. 2F, a semiconductor device 100 includes an N-type TFT 10. The TFT 10 is formed on a glass substrate 101 via an insulating underlying film 102 such as a silicon oxide film. An island-shaped crystalline silicon film 103i constituting the TFT 10 is formed on the insulating underlying film 102. A channel region 110 is formed in the center portion of the island-shaped crystalline silicon film 103i, and a source region 111 and a drain region 112 are formed on both sides thereof. A gate electrode 108 made of aluminum is provided over the channel region 110 via a gate insulating film 107. The surface of the gate electrode 108 is covered with an oxide layer 109. The entire surface of the TFT 10 is covered with an interlevel insulating film 113, and contact holes 113a are formed through the interlevel insulating film 113 at the portions corresponding to the source region 111 and the drain region 112. The source region 111 and the drain region 112 are connected to electrode lines 114 and 115 via the contact holes 113a, respectively.

As shown in FIG. 1A, the crystalline silicon film 103i is a part of a laterally crystallized region 103b formed by the crystallization from the crystalline silicon region 103a in the vicinity of the crystalline silicon film 103i towards a direction parallel to the surface of the substrate. The crystalline silicon film 103i is positioned by performing a mask alignment using the boundary between the laterally crystallized region 103b and an amorphous silicon region 103c which has not been crystallized yet. A catalyst element, e.g., nickel in this example, for promoting the crystallization of the amorphous silicon film by heat treatment is introduced into the crystalline silicon region 103a and the laterally crystallized region 103b, and these two regions 103a and 103b consist of needle-like crystals or column-like crystals in which the crystal grains are substantially in a single crystalline state.

The TFT 10 of this example can be used not only as a driver circuit for an active-matrix type liquid crystal display device and a device constituting the pixel portions, but also as a device for constituting a central processing unit (CPU) formed on the same substrate having these circuits and the pixel portions thereon. The TFT is applicable to a so-called thin-film integrated circuit as well as a liquid crystal display device.

Next, a method for fabricating the TFT 10 will be described.

First, an underlying film 102 made of silicon oxide having a thickness of about 200 nm is formed on a glass substrate 101 by a sputtering method or the like. This silicon oxide film is provided for preventing the impurities from diffusing from the glass substrate 101. Next, an intrinsic (type I) amorphous silicon film (a-Si film) 103 having a thickness in an approximate range of 25 to 100 nm, e.g., 80 nm, is grown thereon by a low-pressure chemical vapor deposition (LPCVD) method or a plasma CVD method.

Then, a mask 104 constituted by a silicon oxide film, a silicon nitride film or the like is formed. The a-Si film 103 is exposed through a slit-shaped opening 104a of the mask 104. That is to say, as shown in FIG. 1A, if the device 100 in the state as shown in FIG. 2A is seen from above, the slit-shaped a-Si film 103 is exposed in a region 100a, while the other regions are still masked.

In this example, the TFT 10 is fabricated so that the source region 111 and the drain region 112 are disposed along the direction 106 of the lateral crystallization, as shown in FIG. 1A. Alternatively, if the source region 111 and the drain region 112 are disposed in a direction vertical to the direction 106 as shown in FIG. 1B, the TFT can be fabricated in the same way without causing any problem.

After the mask 104 is formed; as shown in FIG. 2B, a nickel-based aqueous solution 105 containing nickel acetate, nickel nitrate or the like is applied over the entire surface of the substrate and then dried uniformly by a spinner. In this case, the concentration of nickel in the aqueous solution 105 is suitably in the range of 10 to 200 ppm, preferably 100 ppm. In the region 100a, precipitated Ni ions are in contact with the a-Si film 103, and therefore a very small amount of nickel has already been added selectively into the region 100a. In this example, nickel is used as the catalyst element for promoting the crystallization of the amorphous silicon film. In place of nickel, the same effects can be attained by using cobalt, palladium, platinum, silver, gold, indium, tin, aluminum, phosphorus, arsenic, or antimony. Furthermore, the very small amount of catalyst element can be added by other methods, that is to say, a method in which a nickel super-thin film (too thin to be readily observed as a film) is formed, an ion doping method or the like.

Then, the film is annealed to be crystallized at a temperature in the range of 520° to 580° C. for several to several tens of hours, e.g., at 550° C. for 16 hours in this example, under a hydrogen-reduction environment (the partial pressure of hydrogen is preferably in a range of 0.1 to 1 pressure) or an inactive environment (atmospheric pressure).

In this case, the amorphous silicon film 103 is crystallized in the region 100a to which a very small amount of nickel has been added in a direction vertical to the substrate 101, so that a crystalline silicon region 103a to be used as a seed region is formed. Then, as indicated by the arrow 106 in FIG. 2C, the crystals are growing from the region 100a in a lateral direction (or the direction parallel to the substrate), so that a laterally crystallized crystalline silicon film 103b is formed. The other regions of the amorphous silicon film remain an amorphous silicon region 103c. When the crystals are growing, the distance of the crystal growth in a direction parallel to the substrate as indicated by the arrow 106 is approximately 80 μm.

Thereafter, as shown in FIG. 2D, the mask 104 is removed and the unnecessary portions of the crystalline silicon film 103 are removed by patterning the silicon film so as to isolate the respective TFTs; thereby forming a crystalline silicon film 103i to be used as an active region (the source, drain and channel regions) for a TFT.

For performing this patterning process, either a circular alignment mark as shown in FIGS. 3A, 3B and 4, or a linear alignment mark as shown in FIGS. 5A, 5B and 6 can be used as described in the explanation of the fundamental principle of the invention. A mask alignment mark of a similar shape can also be used. In any case, the mask alignment is performed in the above-mentioned manner.

That is to say, according to a conventional method, the mask alignment is performed by using a boundary between a seed region 103a of a crystalline silicon film and a laterally crystallized region 103b, and then a photolithography process is performed so as to isolate the respective TFTs. On the other hand, according to the method of this example, the mask alignment is performed by using the boundary 101a between the laterally crystallized crystalline silicon region 103b and the amorphous silicon region 103c, and then the photo-lithography process is performed so as to isolate the respective TFTs. Accordingly, the mask alignment can be performed more precisely. Consequently, a semiconductor device can be formed with higher controllability within the laterally crystallized crystalline silicon region 103b in which a more satisfactory crystallinity is exhibited and the concentration of the catalyst element is lower as compared with the seed region 103a. In addition, unstable factors such as the degradation and the variation of the TFT characteristics can be reduced; thus allowing for the fabrication of a TFT having stable characteristics.

Subsequently, a silicon oxide film having a thickness in an approximate range of 20 to 150 nm, e.g., 100 nm, is formed as a gate insulating film 107 so as to cover the crystalline silicon film 103i to be used as an active region. The silicon oxide film is formed by decomposing and depositing tetra ethoxy silane (TEOS) to be used as a source gas with oxygen by heating the substrate at a temperature in a range of 150° to 600° C., more preferably in a range of 300° to 450° C. by an RF plasma CVD method. Also, the silicon oxide film can be formed by decomposing and depositing TEOS to be used as a source gas with ozone by heating the substrate at a temperature in a range of 350° to 600° C., more preferably in a range of 400° to 550° C. by a low-pressure CVD method or an atmospheric pressure CVD method. After the silicon oxide film has been deposited, the annealing is performed at a temperature in a range of 400° to 600° C. for 30 to 60 minutes in order to improve the bulk characteristics of the gate insulating film itself and the characteristics in the interface between the crystalline silicon film and the gate insulating film.

Thereafter, aluminum is deposited by a sputtering method on the silicon oxide film so as to have a thickness of 400 to 800 nm, e.g., 600 nm. The aluminum film is then patterned so as to form a gate electrode 108. The surface of the aluminum gate electrode 108 is anodized, thereby forming an oxide layer 109 thereon, as shown in FIG. 2E. In this case, the anodization is conducted in an ethyleneglycol solution containing 1 to 5% tartaric acid by initially supplying a constant current so as to increase the voltage up to 220 V and then by maintaining the state for an hour, thereby completing the treatment. The thickness of the resulting oxide layer 109 is 200 nm. Since the thickness of the oxide layer 109 defines a length of an offset gate region during a subsequent ion doping process, the length of the offset gate region is controlled by the anodization process.

Next, using the gate electrode 108 and the oxide layer 109 covering the gate electrode 108 as masks, the active region is doped with an impurity (phosphorus) by an ion doping method. Phosphine (PH$_3$) is used as a doping gas, the accelerating voltage is set to be in a range of 60 to 90 kV, e.g., 80 kV, and the implant dose is set to be in a range of $1 \times 10^{15}$ to $8 \times 10^{15}$ cm$^{-2}$, e.g., $2 \times 10^{15}$ cm$^{-2}$. By performing this process step, the impurity-doped regions 111 and 112 will respectively be used as the source and drain regions for the TFT 10; the undoped region 110 masked by the gate electrode 108, and the surrounding oxide layer 109 will be used as the channel region for the TFT 10.

Then, as shown in FIG. 2E, the annealing is conducted by the irradiation of the laser beam; thereby activating the doped impurity and improving the crystallinity of the doped portions which was deteriorated during the impurity implantation process. In this irradiation step, an XeCl excimer laser (wavelength: 308 nm and pulse width: 40 nsec) is irradiated at an energy density of 150 to 400 mJ/cm$^2$, more preferably in a range of 200 to 250 mJ/cm$^2$. The sheet resistance of the N-type impurity (phosphorus) regions 111 and 112 thus formed is in a range of 200 to 800 Ω/□.

A silicon oxide film or a silicon nitride film having a thickness of about 600 nm is then formed as the interlevel insulating film 113. If a silicon oxide film is formed using TEOS as a source material, by a plasma CVD method using oxygen, or by a low-pressure CVD method or an atmospheric-pressure CVD method using ozone, then a satisfactory interlevel insulating film excellent in step coverage can be obtained. If a silicon nitride film is grown using SiH$_4$ and NH$_3$ as source gases by the plasma CVD method, then the dangling bonds are terminated by hydrogen atoms supplied to the active region/gate insulating film interface, and the deterioration of the properties of a TFT can be advantageously suppressed.

Contact holes 113a are then formed in the interlevel insulating film 113, thereby forming the electrode lines 114 and 115 for a TFT by using a double-layered film made of metallic materials such as titanium nitride and aluminum. Finally, the annealing is conducted under a hydrogen environment at one atmospheric pressure at 350° C. for 30 minutes, thereby completing the TFT 10 as shown in FIG. 2F.

Where the TFT thus obtained is used as a switching element for a pixel electrode, one of the electrode lines 114 and 115 is connected to the pixel electrode formed by a transparent conductive film made of indium tin oxide (ITO) or the like and a signal is input from the other electrode. In the case where the TFT is used for a thin-film integrated circuit, it is required to form a contact hole on the gate electrode 108 and to provide necessary lines. The N-type TFT fabricated according to the method of this example exhibits satisfactory characteristics. That is to say, the field-effect mobility of the TFT is in a range of 80 to 120 cm$^2$/Vs, and the threshold voltage is in a range of 2 to 3 V.

As described above, in this example, since the mask alignment is performed by using the boundary 101a between the crystalline silicon region 103b formed by selective crystallization of the amorphous silicon film 103 and the amorphous silicon region 103c of the amorphous silicon film 103 which has not been crystallized yet; the selectively crystallized amorphous silicon film can be patterned easily and precisely based on the boundary portion between the amorphous silicon region 103c and the crystalline silicon region 103b having apparently different gradations.

Therefore, various factors causing the degradation and the variation in the characteristics of a semiconductor device can be substantially eliminated, and the production yield, particularly important for a large-scale semiconductor device, can be considerably improved. In addition, the auto-alignment of the active region 103i with the crystalline silicon region 103b of high quality can be performed, thereby allowing for a mass-production of semiconductor devices using a semiconductor film in which the grain boundaries are controlled.

Moreover, the amorphous silicon film 103 to which a catalyst element is introduced is selectively crystallized by a heat treatment and is further crystallized in the region surrounding the region 103a to which the catalyst element is selectively introduced, in the direction substantially parallel to the surface of the substrate; thereby forming the crystalline silicon region 103b. Therefore, a crystalline silicon film with a crystallinity of higher quality as compared with the crystallinity resulting from a generally used solid-phase growth method can be formed by performing a heat treatment at 600° C. or lower, and the mask alignment can be performed easily during each process step.

The preferred embodiment of the present invention has been described in detail. However the present invention is not limited to the embodiment described above, and various modifications can be readily made depending upon the technological spirit of the invention. For example, in the case where a seed region is formed by a selective irradiation of a laser beam or the implantation of Si+ ions and the seed region is then crystallized by a heat treatment as suggested in Japanese Laid-Open Patent Publications Nos. 64-57615, 4-119633, 6-29320, 3-155124, and 5-136048, or in the cases of employing other techniques for controlling the grain boundaries; the present invention makes it possible to perform the mask alignment precisely. As a result, a semiconductor device can be formed with higher controllability in a desired crystalline silicon region.

The present invention is applicable to various devices other than an active-matrix substrate for a liquid crystal display. For example, the invention is applicable to various devices such as a close-contact type image sensor, a driver-monolithic thermal head, a driver-monolithic optical write device or display device using organic electroluminescent (EL) elements as light-emitting elements, and a semiconductor device such as a three-dimensional IC. The organic electroluminescent (EL) elements herein refer to field-effect light-emitting elements using organic materials as the light-emitting materials.

In the case of applying the present invention to these devices, high-performance characteristics such as a fast response and a high resolution can be realized for these devices. Furthermore, the present invention is broadly applicable not only to a metal-oxide-semiconductor (MOS) transistor described in the above example, but also to a semiconductor process in general for a bipolar transistor, an electrostatic induction transistor or the like utilizing a crystalline semiconductor as a device material.

As described above, according to the present invention, since the mask alignment is performed by using the boundary between the crystalline silicon region formed by selective crystallization of the amorphous silicon film and the amorphous silicon region which has not been crystallized yet, the selectively crystallized amorphous silicon film can be patterned easily and precisely based on the boundary portion between the amorphous silicon film and the crystalline silicon film having apparently different gradations.

Therefore, various factors causing the degradation and the variation in the characteristics of a semiconductor device can be substantially eliminated, and the production yield, particularly important for a large-scale semiconductor device, can be considerably improved. In addition, the auto-alignment of the active region with the crystalline silicon region of high quality can be performed, thereby allowing for a mass-production of semiconductor devices using a semiconductor film in which the grain boundaries are controlled.

Moreover, according to the present invention, the amorphous silicon film to which a catalyst element is introduced is selectively crystallized by a heat treatment and is further crystallized in the region surrounding the region to which the catalyst element is selectively introduced in the direction substantially parallel to the surface of the substrate; thereby performing the mask alignment by using the boundary, located in the outer periphery of the crystalline silicon region thus formed, between the crystalline silicon region and the amorphous silicon region which has not been crystallized yet. Therefore, a crystalline silicon film with a crystallinity of higher quality as compared with the crystallinity resulting from a generally used solid-phase growth method can be formed by performing a heat treatment at 600° C. or lower, and the mask alignment can be performed easily during each process step.

As is apparent from the foregoing description, the present invention makes it possible to fabricate a high-performance large-scale semiconductor device at a low fabrication cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device comprising the steps of:

forming an amorphous silicon film on a substrate;

selectively crystallizing a part of the amorphous silicon film in a first crystallized region and a second crystallized region laterally extending away from the first region to a boundary between a crystalline silicon region formed by the selectively crystallized part of the amorphous silicon film and an amorphous silicon region of the amorphous silicon film which has not been crystallized yet;

performing a mask alignment using the boundary; and patterning the amorphous silicon film depending upon the mask alignment.

2. A method for fabricating a semiconductor device comprising the steps of:

forming an amorphous silicon film on a substrate;

selectively introducing into the amorphous silicon film a catalyst element for promoting a crystallization of the amorphous silicon film before or after the step of forming the amorphous silicon film on the substrate;

selectively crystallizing the amorphous silicon film by a heat treatment so that crystals are grown in a region around a region to which the catalyst element is selectively introduced, in a direction substantially parallel to a surface of the substrate;

performing a mask alignment by using a boundary between a crystalline silicon region formed by selective crystallization of the amorphous silicon film in the direction substantially parallel to the surface of the substrate and an amorphous silicon region which has not been crystallized yet, the boundary being located in an outer periphery of the crystalline silicon region; and patterning the amorphous silicon film depending upon the mask alignment so as to form an active region.

3. A method for fabricating a semiconductor device according to claim 2, wherein at least one element selected from a group consisting of Ni, Co, Pd, Pt, Cu, Ag, Au, In, Sn, Al, P, As and Sb is used as the catalyst element.

4. A method for fabricating a semiconductor device comprising the steps of:

forming an amorphous silicon film on a substrate;

selectively crystallizing a region of the amorphous silicon film including initially crystallizing a seed region included in the selectively crystallized region of the amorphous silicon film and crystallizing the amorphous silicon film from the seed region in a lateral direction, thereby forming a mask alignment mark defined by a boundary between the selectively crystallized region and an amorphous silicon region; and performing a mask alignment by using the mask alignment mark.

5. A method for fabricating a semiconductor device according to claim 4, wherein the step of forming the mask alignment mark comprises the steps of: initially crystallizing a seed region included in the selectively crystallized region of the amorphous silicon film; crystallizing the amorphous silicon film from the seed region in a lateral direction; and enlarging a size of the mask alignment mark in accordance with the crystallization of the amorphous silicon film.

6. A method for fabricating a semiconductor device according to claim 5, wherein the step of performing the mask alignment comprises aligning a position of a second mask alignment mark with a position of the mask alignment mark, the second mask alignment mark corresponding to one of a plurality of curves or lines or one of plural lines and curves arranged in a uniform manner.

7. A method for fabricating a semiconductor device according to claim 6, wherein the second mask alignment mark corresponds to one of three or more closed curves arranged concentrically.

8. A method for fabricating a semiconductor device according to claim 5, wherein the step of forming the mask alignment mark comprises selectively introducing into the seed region of the amorphous silicon film a catalyst element for promoting the crystallization of the amorphous silicon film.

9. A method for fabricating a semiconductor device according to claim 8, wherein at least one element selected from a group consisting of Ni, Co, Pd, Pt, Cu, Ag, Au, In, Sn, Al, P, As and Sb is used as the catalyst element.

10. A method for fabricating a semiconductor device comprising the steps of:

forming an amorphous silicon film on a substrate;

selectively introducing into the amorphous silicon film a catalyst element for promoting crystallization of the amorphous silicon;

selectively crystallizing the amorphous silicon film by heat treatment;

forming a mask alignment using a boundary between the selectively crystallized region and an amorphous silicon region; and patterning the amorphous silicon film depending upon the mask alignment.

11. The method for fabricating a semiconductor device according to claim 2, wherein the selectively crystallizing step results in crystals being grown around a region where the catalyst element is selectively introduced in a direction substantially parallel to a surface of the substrate.

12. The method for fabricating a semiconductor device according to claim 10, wherein the boundary is located in an outer periphery of a crystalline silicon region grown around a region to which the catalyst element is selectively introduced.

13. A method for fabricating a semiconductor device comprising the steps of:

forming an amorphous silicon film on a substrate; and selectively crystallizing a region of the amorphous silicon film to form a mask alignment mark defined by a boundary between the selectively crystallized region and an amorphous silicon region wherein a seed included in the selectively crystallized region is initially crystallized.

14. The method for fabricating a semiconductor device according to claim 13, wherein the amorphous silicon film crystallized from the seed region grows in a lateral direction away from the seed region, the boundary moving in accordance with the growth of the seed region.

* * * * *